US011770921B2

(12) United States Patent
Lee et al.

(10) Patent No.: US 11,770,921 B2
(45) Date of Patent: Sep. 26, 2023

(54) APPARATUS, METHOD AND RECORDING MEDIUM STORING COMMAND FOR DETERMINING MOUNTING INFORMATION

(71) Applicant: KOH YOUNG TECHNOLOGY INC., Seoul (KR)

(72) Inventors: Duk Young Lee, Suwon-si (KR); Jae Hwan Lee, Seoul (KR); Jin Hyung Tak, Seongnam-si (KR); Chan Woo Park, Seoul (KR); Guk Han, Ansan-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 123 days.

(21) Appl. No.: 17/235,551

(22) Filed: Apr. 20, 2021

(65) Prior Publication Data

US 2022/0142028 A1    May 5, 2022

(30) Foreign Application Priority Data

Nov. 3, 2020 (KR) ........................ 10-2020-0145098

(51) Int. Cl.
    *H05K 13/08*     (2006.01)
    *G05B 19/418*    (2006.01)
(52) U.S. Cl.
    CPC ... *H05K 13/0882* (2018.08); *G05B 19/41885* (2013.01); *H05K 13/089* (2018.08); *G05B 2219/45029* (2013.01)
(58) Field of Classification Search
    CPC ............. H05K 13/0882; H05K 13/089; H05K 13/0817; H05K 13/083; H05K 13/0465;
    (Continued)

(56) References Cited

U.S. PATENT DOCUMENTS

| 7,167,583 B1 | 1/2007 | Lipson et al. |
| 2010/0152877 A1* | 6/2010 | Maenishi ........... H05K 13/0452 700/121 |

(Continued)

FOREIGN PATENT DOCUMENTS

| CN | 106416455 | 2/2017 |
| CN | 109946319 | 6/2019 |

(Continued)

OTHER PUBLICATIONS

Korean Office Action with English Translation for Korean Patent Application No. 10-2020-0145098 dated Dec. 29, 2021.

(Continued)

*Primary Examiner* — Thomas C Lee
*Assistant Examiner* — Michael Tang
(74) *Attorney, Agent, or Firm* — KILE PARK REED & HOUTTEMAN PLLC

(57) ABSTRACT

The present disclosure provides an apparatus for determining mounting information. The apparatus according to the present disclosure may be configured to acquire solder measurement information indicating a state of a solder printed on a first substrate, determine whether or not the state of the solder is changed from states of solders printed on second substrates, which are measured prior to measurement of the first substrate, based on the solder measurement information, upon the determination that the state of the solder is not changed, determine mounting information indicating a mounting condition for mounting a first component on the first substrate using one or more models, and deliver the mounting information to a mounter. The one or more models may be configured to output the mounting information based on a correlation between states of a second component before and after a reflow process for each of the second substrates.

18 Claims, 8 Drawing Sheets

(58) Field of Classification Search
CPC .......... H05K 13/0812; G05B 19/41885; G05B 2219/45029
USPC .................................. 700/121; 29/739, 832
See application file for complete search history.

(56) References Cited

U.S. PATENT DOCUMENTS

| | | | | |
|---|---|---|---|---|
| 2014/0291006 | A1* | 10/2014 | Yamamoto | H05K 3/363 228/180.1 |
| 2017/0242955 | A1* | 8/2017 | Ono | G06F 30/398 |
| 2017/0367229 | A1 | 12/2017 | Kim | |
| 2018/0049356 | A1* | 2/2018 | Mori | G01N 21/95684 |
| 2019/0200494 | A1* | 6/2019 | Kim | B41F 33/0045 |
| 2019/0364707 | A1* | 11/2019 | Futamura | G01N 21/956 |
| 2020/0367396 | A1 | 11/2020 | Kim | |
| 2021/0042910 | A1 | 2/2021 | Lee et al. | |
| 2021/0049753 | A1 | 2/2021 | Lee et al. | |
| 2021/0105920 | A1 | 4/2021 | Lee et al. | |
| 2021/0404973 | A1 | 12/2021 | Lee et al. | |
| 2022/0151120 | A1* | 5/2022 | Kubota | H05K 3/34 |

FOREIGN PATENT DOCUMENTS

| | | | |
|---|---|---|---|
| CN | 111492727 | 8/2020 | |
| CN | 111788476 | 10/2020 | |
| CN | 111788883 | 10/2020 | |
| EP | 3 119 176 | 1/2017 | |
| EP | 3 687 272 | 7/2020 | |
| JP | 2004-502250 | 1/2004 | |
| JP | 2020043159 A | * 3/2020 | |
| JP | 2020-161748 | 10/2020 | |
| JP | 2020-161749 | 10/2020 | |
| JP | 2020-161750 | 10/2020 | |
| KR | 10-2020-0035387 | 4/2020 | |
| KR | 10-2020-0063079 | 6/2020 | |
| WO | 2012/096004 | 7/2012 | |
| WO | WO-2014080502 A1 | * 5/2014 | ......... H05K 13/0465 |
| WO | 2015/029255 | 3/2015 | |

OTHER PUBLICATIONS

European Office Action for European Application No. or Patent No. 21169281.9, dated Oct. 11, 2021.
Office Action with English translation for Chinese Patent Application No. 202011278230.6, dated Jun. 29, 2023.

* cited by examiner

APPARATUS, METHOD AND RECORDING MEDIUM STORING COMMAND FOR DETERMINING MOUNTING INFORMATION

CROSS-REFERENCE TO RELATED APPLICATION

This application is based upon and claims the benefit of priority from Korean Patent Application No. 10-2020-0145098, filed on Nov. 3, 2020, the entire contents of which are incorporated herein by reference.

TECHNICAL FIELD

The present disclosure relates to a technique for determining mounting information.

The present disclosure is derived from research conducted as a part of the 'Smart Manufacturing R&D' project of the Korea Industrial Complex Corporation [Project identification number: 1415166035, Research Title: Development of Real-Time Smart Solution For Surface Mounting Technology (SMT)]

BACKGROUND

A substrate processing process according to a surface mount technology (SMT) may be performed on a substrate. In the substrate processing process, a component may be mounted on a solder printed on the substrate, and may be bonded to the substrate through a reflow process. The final state (e.g., the position, the orientation, etc.) of the component bonded to the substrate may be determined by various factors. For example, the state of the printed solder, the state of the component immediately after a mounting process of the component and before the reflow process, and the like may affect the state of the component after the reflow process. If the bonded component after the reflow process does not make a good contact with the pads (electrodes) of the substrate, it may cause a defect in the substrate. Therefore, it is required to determine the exact mounting position of the component which makes the component properly bond to the pads after the reflow process.

SUMMARY

Various embodiments of the present disclosure provide a technique for determining mounting information.

As one aspect of the present disclosure, an apparatus for determining mounting information can be provided. The apparatus according to one aspect of the present disclosure may include: one or more processors; and one or more memories configured to store commands that cause the one or more processors to perform an operation when executed by the one or more processors, wherein the one or more processors may be configured to acquire solder measurement information indicating a state of a solder printed on a first substrate, determine whether or not the state of the solder is changed from states of solders printed on second substrates, which are measured prior to measurement of the first substrate, based on the solder measurement information, upon the determination that the state of the solder is not changed, determine mounting information indicating a mounting condition for mounting a first component on the first substrate using one or more models stored in the one or more memories, and deliver the mounting information to a mounter, and the one or more models may be configured to output the mounting information for the first substrate based on a correlation between states of a second component before and after a reflow process for each of the second substrates.

In one embodiment, the one or more models may include a first model and a second model, the first model may be configured to determine an objective function for predicting a state of the first component after a reflow process for the first substrate from a state of the first component before the reflow process for the first substrate, based on information indicating the states of the second component before and after the reflow process for each of the second substrates, and the second model may be configured to output the mounting information using the objective function.

In one embodiment, the mounting condition for mounting the first component is a condition that minimizes a positional offset of the first component with respect to pads on the first substrate after the reflow process for the first substrate.

In one embodiment, the one or more processors may be further configured to input previous component measurement information indicating the state of the first component before the reflow process for the first substrate and subsequent component measurement information indicating the state of the first component after the reflow process for the first substrate, to the first model.

In one embodiment, the one or more processors may be further configured to input the mounting information and subsequent component measurement information indicating the state of the first component after the reflow process for the first substrate, to the first model.

In one embodiment, the one or more processors may be further configured to initialize the first model upon the determination that the state of the solder printed on the first substrate is changed.

In one embodiment, the apparatus may further include: a communication circuit configured to communicate with a first measurement device, the mounter, a second measurement device and a third measurement device, wherein the first measurement device is configured to measure the state of the solder printed on the first substrate, the mounter is configured to mount the first component on the first substrate based on the mounting information, the second measurement device is configured to measure the state of the first component before a reflow process for the first substrate, and the third measurement device is configured to measure the state of the first component after the reflow process for the first substrate.

In one embodiment, the state of the solder printed on the first substrate may include at least one selected from a position, an orientation, a volume, a height and an area of the solder.

As another aspect of the present disclosure, a method for determining mounting information can be provided. The method according to another aspect of the present disclosure may include: acquiring, by one or more processors, solder measurement information indicating a state of a solder printed on a first substrate; determining, by the one or more processors, whether or not the state of the solder is changed from states of solders printed on second substrates, which are measured prior to measurement of the first substrate, based on the solder measurement information; upon the determination that the state of the solder is not changed, determining, by the one or more processors, mounting information indicating a mounting condition for mounting a first component on the first substrate using one or more models stored in one or more memories; and delivering, by the one or more processors, the mounting information to a mounter by controlling a communication circuit, wherein the one or more models may be configured to output the mounting information for the first substrate based on a correlation between states of a second component before and after a reflow process for each of the second substrates.

In one embodiment, the one or more models may include a first model and a second model, the first model may be configured to determine an objective function for predicting a state of the first component after a reflow process for the first substrate from a state of the first component before the reflow process for the first substrate, based on information indicating the states of the second component before and after the reflow process for each of the second substrates, and the second model may be configured to output the mounting information using the objective function.

In one embodiment, the mounting condition for mounting the first component is a condition that minimizes a positional offset of the first component with respect to pads on the first substrate after the reflow process for the first substrate.

In one embodiment, the method may further include: inputting, by the one or more processors, previous component measurement information indicating the state of the first component before the reflow process for the first substrate and subsequent component measurement information indicating the state of the first component after the reflow process for the first substrate, to the first model.

In one embodiment, the method may further include: inputting, by the one or more processors, the mounting information and subsequent component measurement information indicating the state of the first component after the reflow process for the first substrate, to the first model.

In one embodiment, the method may further include: initializing, by the one or more processors, the first model upon the determination that the state of the solder printed on the first substrate is changed.

In one embodiment, the communication circuit may be configured to communicate with a first measurement device, the mounter, a second measurement device and a third measurement device, wherein the first measurement device is configured to measure the state of the solder printed on the first substrate, the mounter is configured to mount the first component on the first substrate based on the mounting information, the second measurement device is configured to measure the state of the first component before the reflow process for the first substrate, and the third measurement device is configured to measure the state of the first component after the reflow process for the first substrate.

In one embodiment, the state of the solder printed on the first substrate may include at least one selected from a position, an orientation, a volume, a height and an area of the solder.

As a further aspect of the present disclosure, a non-transitory computer-readable recording medium that records commands for determining mounting information may be provided. The commands recorded in the recording medium according to a further aspect of the present disclosure are commands to be executed on a computer that, when executed by the one or more processors, may cause one or more processors to acquire solder measurement information indicating a state of a solder printed on a first substrate, determine whether or not the state of the solder is changed from states of solders printed on second substrates, which are measured prior to measurement of the first substrate, based on the solder measurement information, upon the determination that the state of the solder is not changed, determine mounting information indicating a mounting condition for mounting a first component on the first substrate using one or more models, and deliver the mounting information to a mounter. The one or more models may be configured to output the mounting information for the first substrate based on a correlation between states of a second component before and after a reflow process for each of the second substrates.

In one embodiment, the one or more models may include a first model and a second model, the first model may be configured to determine an objective function for predicting a state of the first component after a reflow process for the first substrate from a state of the first component before the reflow process for the first substrate, based on information indicating the states of the second component before and after the reflow process for each of the second substrates, and the second model may be configured to output the mounting information using the objective function.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
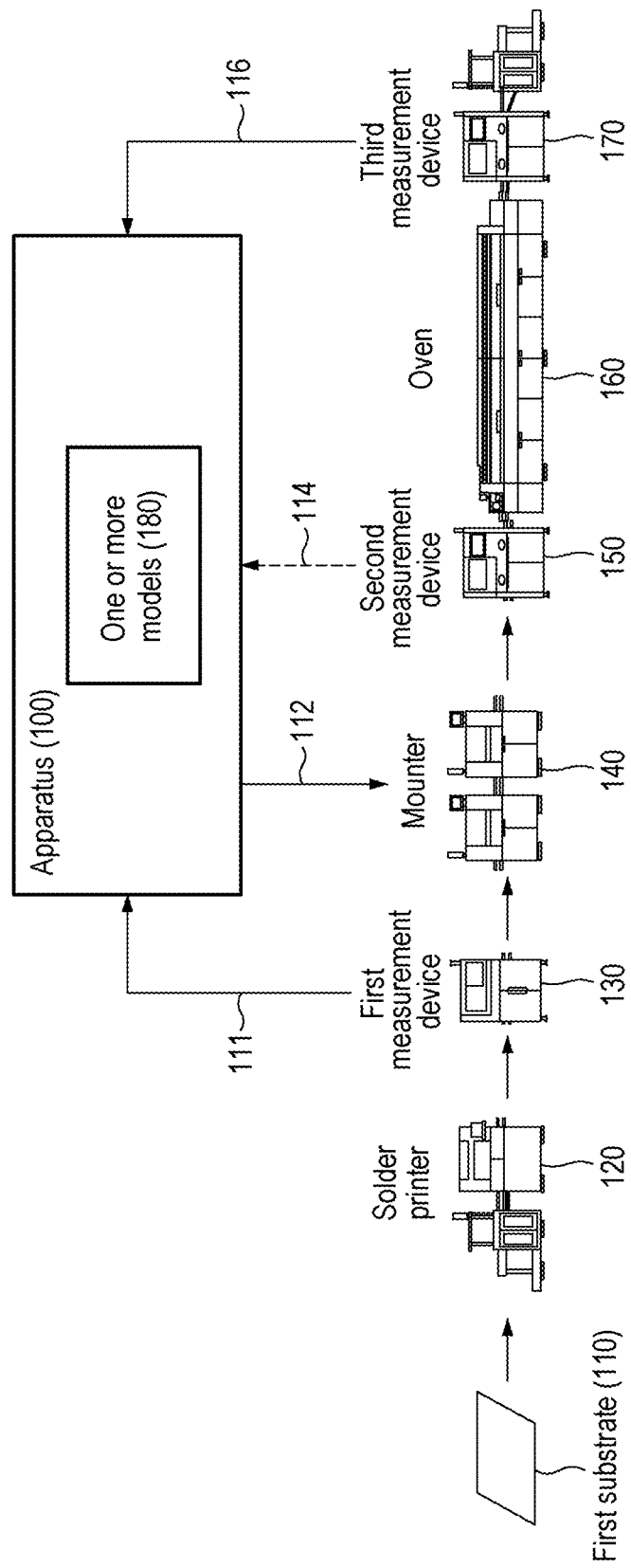
FIG. 1 is a diagram illustrating an operation process of an apparatus for determining mounting information according to an embodiment of the present disclosure.

The various embodiments described herein are exemplified for the purpose of clearly describing the technical contents of the present disclosure, and are not intended to limit the technical contents of the present disclosure to specific embodiments. The technical contents of the present disclosure include various modifications, equivalents, alternatives of each of the embodiments described in this document, and embodiments selectively combined from all or part of the respective embodiments. In addition, the scope of the technical contents of the present disclosure is not limited to various embodiments or detailed descriptions thereof presented below.

The terms used herein, including technical or scientific terms, may have meanings that are generally understood by a person of ordinary skilled in the art to which the present disclosure pertains, unless otherwise specified.

As used herein, expressions such as "include", "may include", "provided with", "may be provided with", "have", and "may have" mean the presence of subject features (e.g., functions, operations, components, etc.) and does not exclude the presence of other additional features. That is, such expressions should be understood as open-ended terms that imply the possibility of including other embodiments.

A singular expression can include meanings of plurality, unless otherwise mentioned, and the same is applicable to a singular expression stated in the claims.

The terms "first", "second", etc. used herein are used to identify a plurality of components from one another, and are not intended to limit the order or importance of the relevant components.

As used herein, expressions such as "A, B and C", "A, B or C", "A, B and/or C", "at least one of A, B and C", "at least one of A, B or C", "at least one of A, B and/or C", "at least one selected from A, B and C", "at least one selected from A, B or C", and "at least one selected from A, B and/or C" may mean each of the listed items or all available combinations of the listed items. For example, the expression "at least one selected from A and B" may refer to (1) A, (2) at least one of A, (3) B, (4) at least one of B, (5) at least one of A and at least one of B, (6) at least one of A and B, (7) at least one of B and A, and (8) both A and B.

The expression "based on" used herein is used to describe one or more factors that influences a decision, an action of judgment or an operation described in a phrase or sentence including the relevant expression, and this expression does not exclude additional factors influencing the decision, the action of judgment or the operation.

As used herein, the expression that a certain component (e.g., a first component) is "connected" to another component (e.g., a second component) may mean that the certain component is connected to another component either directly or via a new other component (e.g., a third component).

As used herein, the expression "configured to" may have a meaning such as "set to", "having the ability to", "modified to", "made to", "capable of", or the like depending on the context. The expression is not limited to the meaning of "specially designed for hardware".

In order to describe various embodiments of the present disclosure, a Cartesian coordinate system having an X axis, a Y axis and a Z axis orthogonal to each other may be defined. As used herein, the expression such as "X-axis direction", "Y-axis direction" or "Z-axis direction" of the Cartesian coordinate system may refer to two directions toward which each axis of the Cartesian coordinate system extends, unless specifically defined otherwise in the corresponding description. In addition, the + sign in front of each axis direction may mean a positive direction, which is one of the two directions extending along the corresponding axis, and the − sign in front of each axis direction may mean a negative direction, which is the other of the two directions extending along the corresponding axis.

In the present disclosure, a substrate is a plate or container on which elements such as semiconductor chips or the like are mounted, and may provide a path for delivering electrical signals between the mounted elements. The substrate may be used for fabricating an integrated circuit or the like, and may be made of a material such as silicon or the like. For example, the substrate may be a printed circuit board (PCB), and may also be referred to as a wafer.

Hereinafter, various embodiments of the present disclosure will be described with reference to the accompanying drawings. In the accompanying drawings and the descriptions of the drawings, the same reference numerals may be assigned to the same or substantially equivalent elements. Furthermore, in the following description of various embodiments, the overlapping descriptions of the same or corresponding elements may be omitted. However, this does not mean that the elements are not included in the embodiments.

FIG. 1 is a diagram illustrating an operation process of an apparatus 100 for determining mounting information according to an embodiment of the present disclosure. The apparatus 100 according to the present disclosure may determine the mounting information for mounting a component on a substrate based on information acquired in a substrate processing process.

A substrate processing process may be performed on one or more substrates in sequence. The substrate processing process may be a process of mounting and bonding a component to a substrate according to a surface mounting technology. In the substrate processing process, a solder printer 120, a first measurement device 130, a mounter 140, a second measurement device 150, an oven 160 and/or a third measurement device 170 may be used. In the substrate processing process, the solder printer 120 may print a solder on the substrate. The first measurement device 130 may measure the state of the solder printed on the substrate. The mounter 140 may mount a component on the substrate on which the solder is printed. The second measurement device 150 may measure the state of the mounted component. The substrate on which the component is mounted may be inputted to the oven 160 and may undergo a reflow process. During the reflow process, the solder is melted and then cured again, thereby allowing the component to be bonded to the substrate. The third measurement device 170 may measure the state of the component on the substrate after the reflow process.

According to the present disclosure, the substrate processing process may be performed on a substrate (hereinafter referred to as "first substrate 110") for which mounting information 112 is determined. The solder printer 120 may print a solder on the first substrate 110. The solder printer 120 may be referred to as a screen printer. One or more pads may be provided on the first substrate 110. The solder printer 120 may print a solder on each of one or more pads of the first substrate 110. In the present disclosure, the pads may mean a pair of electrodes provided at a position where a component is to be bonded to the substrate. That is, one component may be mounted and bonded to the pads (a pair of electrodes) provided on the substrate.

The first measurement device 130 may measure the state of the solder printed on the first substrate 110. The first measurement device 130 may be referred to as solder paste inspection (SPI) device. The first measurement device 130 may output solder measurement information 111 including the measured state of the solder printed on the first substrate 110. In the present disclosure, the state of the solder may include at least one selected from the position, orientation, volume, height and area of the corresponding solder. In this regard, the position of the solder may mean an absolute position (e.g., coordinates, etc.) on the substrate or a relative position (e.g., a positional offset) from the center of the pads associated with the solder.

The apparatus 100 according to the present disclosure may acquire the solder measurement information 111 from the first measurement device 130. The apparatus 100 may determine, based on the solder measurement information 111, whether or not the state of the solder printed on the first substrate 110 is changed from the states of the solders of the previously processed substrates. Prior to the processing of the first substrate 110, substrate processing processes may have been performed on one or more substrates (hereinafter referred to as "second substrates"). The first measurement device 130 may also have measured the solders printed on the second substrates. Accordingly, the apparatus 100 may determine whether or not the state of the solder printed on the first substrate 110 is changed from the states of the solders printed on the second substrates, which have been measured before the measurement of the first substrate.

Upon the determination that the state of the solder printed on the first substrate 110 is not changed from the previous one, the apparatus 100 may determine the mounting information 112 based on one or more models 180 stored in the apparatus 100. In one embodiment, the mounting information may be information that indicates a mounting condition for mounting a corresponding component (hereinafter referred to as "first component") on the first substrate 110. In the present disclosure, the mounting condition may include a position and/or an orientation in which a component is to be mounted on a substrate. In this regard, the mounting position may be an absolute position (e.g. coordinates, etc.) on a substrate, a relative position (e.g., a positional offset) from the center of the pads associated with the corresponding component, or a relative position (e.g., a positional offset) from the center or center of gravity of the solder associated with the corresponding component. Alternatively, the mounting position may mean a center position of at least two solders printed at positions where a component is mounted, more precisely a relative position from a center point of gravity of the at least two solders. In this regard, the mounting orientation is an angle of the component with respect to the substrate when mounting the component, and may include an angle in a yaw, pitch and/or roll direction.

One or more models 180 may output the mounting information 112 which indicates an optimal mounting condition for mounting the first component on the first substrate 110, based on the correlation between the state before the reflow process and the state after the reflow process of each component mounted on the second substrates. Details of the one or more models 180 will be described later.

When the state of the solder printed on the first substrate 110 is different from the states of the solders printed on the second substrates, the one or more models 180 built based on the information from the second substrates may not be able to output accurate mounting information for the first substrate 110. Therefore, the apparatus 100 may determine the mounting information 112 based on the one or more models 180 only when the state of the solder printed on the first substrate 110 is not changed from the state of the previously printed solder. In one embodiment, when it is determined that the state of the solder printed on the first substrate 110 is changed from the states of the solders printed on the second substrates, the apparatus 100 may initialize the one or more models 180. The initialization of the one or more models may mean an initialization of the parameters/variables of the currently built models such that new model(s) with new sets of parameters/variables can be built using information from the first substrate 110 and subsequent substrates.

The apparatus 100 may deliver the determined mounting information 112 to the mounter 140. The mounter 140 may mount the first component on the first substrate 110 based on the mounting condition indicated by the mounting information 112. The mounter 140 may be referred to as a component mounter.

Thereafter, the second measurement device 150 may measure the state of the first component mounted according to the mounting information 112, i.e., the state of the first component before the reflow process for the first substrate 110. The second measurement device 150 may be referred to as Pre-AOI (Automated Optical Inspection) device. The second measurement device 150 may output previous component measurement information 114 that indicates the measured state of the first component before the reflow process for the first substrate 110. In the present disclosure, the state of the component may mean the position and/or orientation of the component placed on the substrate. In this regard, the position of the component may be an absolute position (e.g. coordinates, etc.) on the substrate, a relative position (e.g., a positional offset) from the center of the pads associated with the corresponding component, or a relative position (e.g., a positional offset) from the center of the solder associated with the corresponding component. In this regard, the orientation of the component is an angle of the corresponding component with respect to the substrate, and may include an angle in a yaw, pitch and/or roll direction.

The first substrate 110 on which the first component is mounted may be inputted to the oven 160 and may undergo a reflow process. The solder may be melted and then cured again through the reflow process. Accordingly, the first component may be bonded to the first substrate 110. If the first substrate 110 has successfully undergone the substrate processing process as the mounting information 112 is properly determined, the first component may be bonded to the corresponding pads on the first substrate 110.

The third measurement device 170 may measure the state of the first component on the first substrate 110 after the reflow process. The third measurement device 170 may be referred to as Post-AOI (Automated Optical Inspection) device. The third measurement device 170 may output subsequent component measurement information 116 that indicates the measured state of the first component after the reflow process for the first substrate 110.

In one embodiment, the subsequent component measurement information 116 may be delivered to the apparatus 100 and inputted to the one or more models 180. In some embodiments, the previous component measurement information 114 and/or the mounting information 112 may also be delivered to the apparatus 100 and inputted to the one or more models 180. The inputted information may be used by the one or more models 180 to predict the above-described correlation. This will be described later.

According to the present disclosure, an accurate component mounting position may be determined by adaptively considering various factors in a substrate processing process. In this regard, the various factors may include the state of the printed solder, the state and form of the component immediately after mounting, the state and form of the component after the reflow process, the process condition of the reflow process, and so on. The state of the solder may mean the position, volume, height, area, etc. of the solder. The state of the component may mean the position, orientation and degree of inclination of the component. The form of the component may mean the size and shape of the component.

Figure 2:
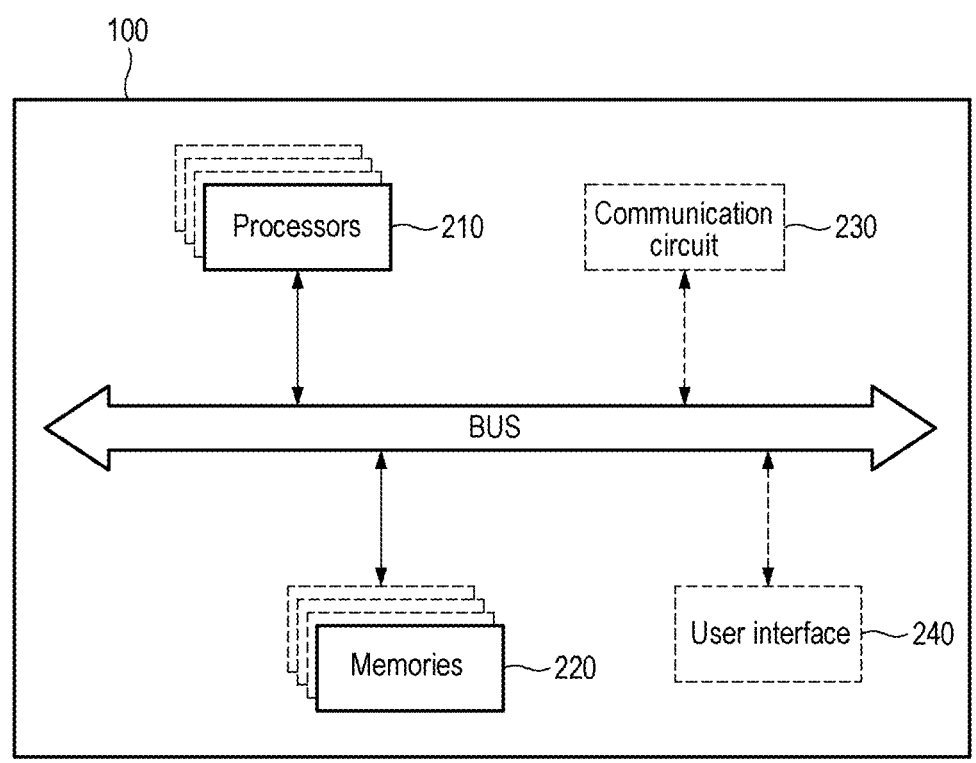
FIG. 2 is a block diagram of the apparatus according to an embodiment of the present disclosure.

FIG. 2 is a block diagram of the apparatus 100 according to an embodiment of the present disclosure. In one embodiment, the apparatus 100 may include one or more processors 210 and/or one or more memories 220. In one embodiment, at least one of these components of the apparatus 100 may be omitted, or another component may be added to the apparatus 100. In one embodiment, additionally or alternatively, some components may be integrated, or may be implemented as a singular entity or plural entities. In the present disclosure, "one or more processors 210" may be expressed as "a processor 210". The expression "a processor 210" may mean a set of one or more processors, unless clearly expressed otherwise in context. In the present disclosure, "one or more memories 220" may be referred to as "a memory 220". The expression "a memory 220" may mean a set of one or more memories, unless clearly expressed otherwise in context. In one embodiment, at least some of the internal and external components of the apparatus 100 may be connected to each other via a bus, a general purpose input/output (GPIO), a serial peripheral interface (SPI), a mobile industry processor interface (MIPI) and the like to exchange data and/or signals.

The processor 210 may control at least one component of the apparatus 100 connected to the processor 210 by driving software (e.g., commands, programs, etc.). Furthermore, the processor 210 may perform various operations related to the present disclosure, such as calculation, treatment, data generation, processing and the like. In addition, the processor 210 may load data or the like from the memory 220 or store the data in the memory 220. In one embodiment, the processor 210 may acquire the solder measurement information 111 indicating the state of the solder printed on the first substrate 110, may determine whether or not the state of the solder is changed from the previous one based on the solder measurement information 111, may determine the mounting information 112 based on the one or more models 180 when it is determined that the state of the solder is not changed, and may deliver the mounting information 112 to the mounter 140.

The memory 220 may store various types of data. The data stored in the memory 220 is data acquired, processed or used by at least one component of the apparatus 100, and may include software (e.g., commands, programs, etc.). The memory 220 may include a volatile and/or nonvolatile memory. In the present disclosure, commands or programs are software stored in the memory 220, and may include an operating system for controlling the resources of the apparatus 100, an application, and/or middleware that provides various functions to the application so that the application can utilize the resources of the apparatus 100. In one embodiment, the memory 220 may store commands that, when executed by the processor 210, cause the processor 210 to perform an operation. In one embodiment, the memory 220 may store the one or more models 180 described above. In one embodiment, the memory 220 may store the solder measurement information, the mounting information, information related to the first component, information related to the first substrate 110, and the like.

In one embodiment, the apparatus 100 may further include a communication circuit 230. The communication circuit 230 may perform wireless or wired communication between the apparatus 100 and a server, or between the apparatus 100 and other devices. For example, the communication circuit 230 may perform wireless communication according to a method such as eMBB (enhanced Mobile Broadband), URLLC (Ultra Reliable Low-Latency Communication), MMTC (Massive Machine Type Communication), LTE (Long-Term Evolution), LTE-A (LTE Advance), NR (New Radio), UMTS (Universal Mobile Telecommunications System), GSM (Global System for Mobile Communication), CDMA (Code Division Multiple Access), WCDMA (Wideband CDMA), WiBro (Wireless Broadband), WiFi (Wireless Fidelity), Bluetooth, NFC (Near Field Communication), GPS (Global Positioning System), or GNSS (Global Navigation Satellite System). For example, the communication circuit 230 may perform wired communication according to a method such as UBS (Universal Serial Bus), HDMI (High Definition Multimedia Interface), RS-232 (Recommended Standard-232), or POTS (Plain Old Telephone Service). In one embodiment, the communication circuit 230 may communicate with the solder printer 120, the first measurement device 130, the mounter 140, the second measurement device 150, the oven 160 and/or the third measurement device 170.

In an embodiment, the processor 210 may control the communication circuit 230 to acquire information necessary for determining the mounting information from the server according to the present disclosure. The information acquired from the server may be stored in the memory 220. In one embodiment, the information acquired from the server may include the one or more models 180 and the like.

In one embodiment, the apparatus 100 may exist in a form combined with at least one of the solder printer 120, the first measurement device 130, the mounter 140, the second measurement device 150, the oven 160 and/or the third measurement device 170, or may exist as a separate apparatus. When the apparatus 100 exists in a form combined with at least one of the above-described devices (e.g., the mounter 140), the apparatus 100 may directly exchange various kinds of information with the corresponding device (e.g., the mounter 140) without going through the communication circuit 230.

In one embodiment, the apparatus 100 may further include a user interface 240. The user interface 240 may receive an input from a user and may output (display) information to the user. In one embodiment, the user interface 240 may include an input device and/or an output device. The input device may be a device that receives information, which is to be delivered to at least one component of the apparatus 100, from the outside. For example, the input device may include a mouse, a keyboard, a touch pad and the like. The output device may be a device that provides various kinds of information on the apparatus 100 to a user in a visual/audible form. For example, the output device may include a display, a projector, a hologram, a speaker and the like. In one embodiment, the user interface 240 may receive information for controlling the apparatus 100, information for controlling a substrate processing process, information for controlling the one or more models 180, information about the first substrate 110, information about the first component, and the like from the user. In one embodiment, the user interface 240 may display the determined mounting information 112 or the like to the user.

In one embodiment, the apparatus 100 may be an apparatus of various types. For example, the apparatus 100 may be a portable communication device, a computer device, a wearable device, or a combination of two or more of the aforementioned devices. However, the apparatus 100 of the present disclosure is not limited to the aforementioned devices.

Various embodiments of the apparatus 100 presented in the present disclosure may be combined with each other. The respective embodiments may be combined according to the number of cases, and the embodiments of the apparatus 100 made by such combination also fall within the scope of the present disclosure. In addition, the internal/external components of the apparatus 100 according to the present disclosure described above may be added, modified, replaced or deleted depending on the embodiments. In addition, the internal/external components of the apparatus 100 described above may be implemented as hardware components.

Figure 3:
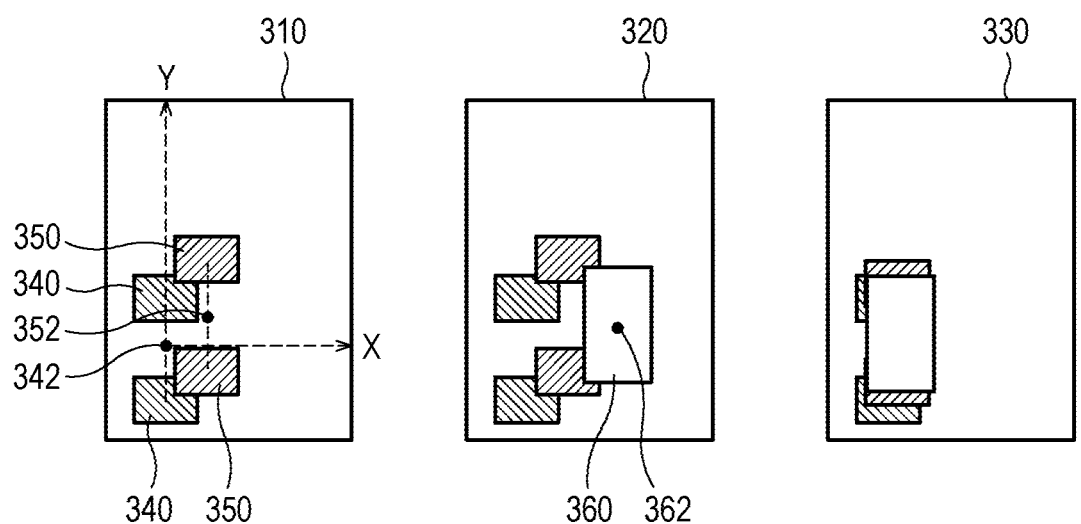
FIG. 3 is a diagram illustrating pads, a solder and a component on a substrate according to an embodiment of the present disclosure.

FIG. 3 is a diagram illustrating pads, a solder and a component on a substrate according to an embodiment of the present disclosure. As described above, pads 340 may be formed on a substrate 310. As described above, the pads 340 may be formed as an electrode pair. In one embodiment, the position of the pads 340 may mean a center point 342 between the two pads. In one embodiment, when the substrate 310 is viewed as a coordinate plane, the center point 342 becomes an origin (0, 0), and may serve as a reference point indicating the positions of solders and components. A solder 350 may be printed on pads 340 to which the solder 350 corresponds. In the present disclosure, a solder may mean a pair of two solders that corresponds to pads, which is an electrode pair. In one embodiment, the position of the solder 350 may mean a center point 352 between the two solders, more precisely a point at which the centers of mass of the two solders exist. In one embodiment, the state of the solder measured by the first measurement device 130 may include a positional offset of the solder with respect to the pads. This positional offset may mean position coordinates, i.e., a two-dimensional vector of the center 352 of the solder with respect to the origin 342.

The component 360 may be mounted on the substrate 320 on which the solder is printed. In one embodiment, the position of the component 360 may mean a position of a center point 362 of the component. As described above, the state of the component measured by the second measurement device 150 may include a positional offset of the mounted component with respect to the pads. This positional offset may mean position coordinates, i.e., a two-dimensional vector of the center 362 of the component with respect to the origin 342.

The substrate 330 on which the component 360 is mounted may undergo a reflow process. During the reflow process, the positions of the solder 350 and the component 360 may be changed due to the surface tension of the solder 350 and other physical causes generated in the process in which the solder 350 is melted and cured. As described above, the state of the component on the substrate 330 after the reflow process, which is measured by the third measurement device 170, may include a positional offset of the component with respect to the pads. This positional offset may mean position coordinates, i.e., a two-dimensional vector of the center 362 of the component with respect to the origin 342 on the substrate 430 after the reflow process. In the present disclosure, as the positional offset of one component on the substrate after the reflow process becomes closer to 0, it may be considered that the bonding of the component is successful. In addition, as the variation in positional offsets of a plurality of components on the substrate after the reflow process becomes smaller, it may be considered that the bonding of the components is successful.

Figure 4:
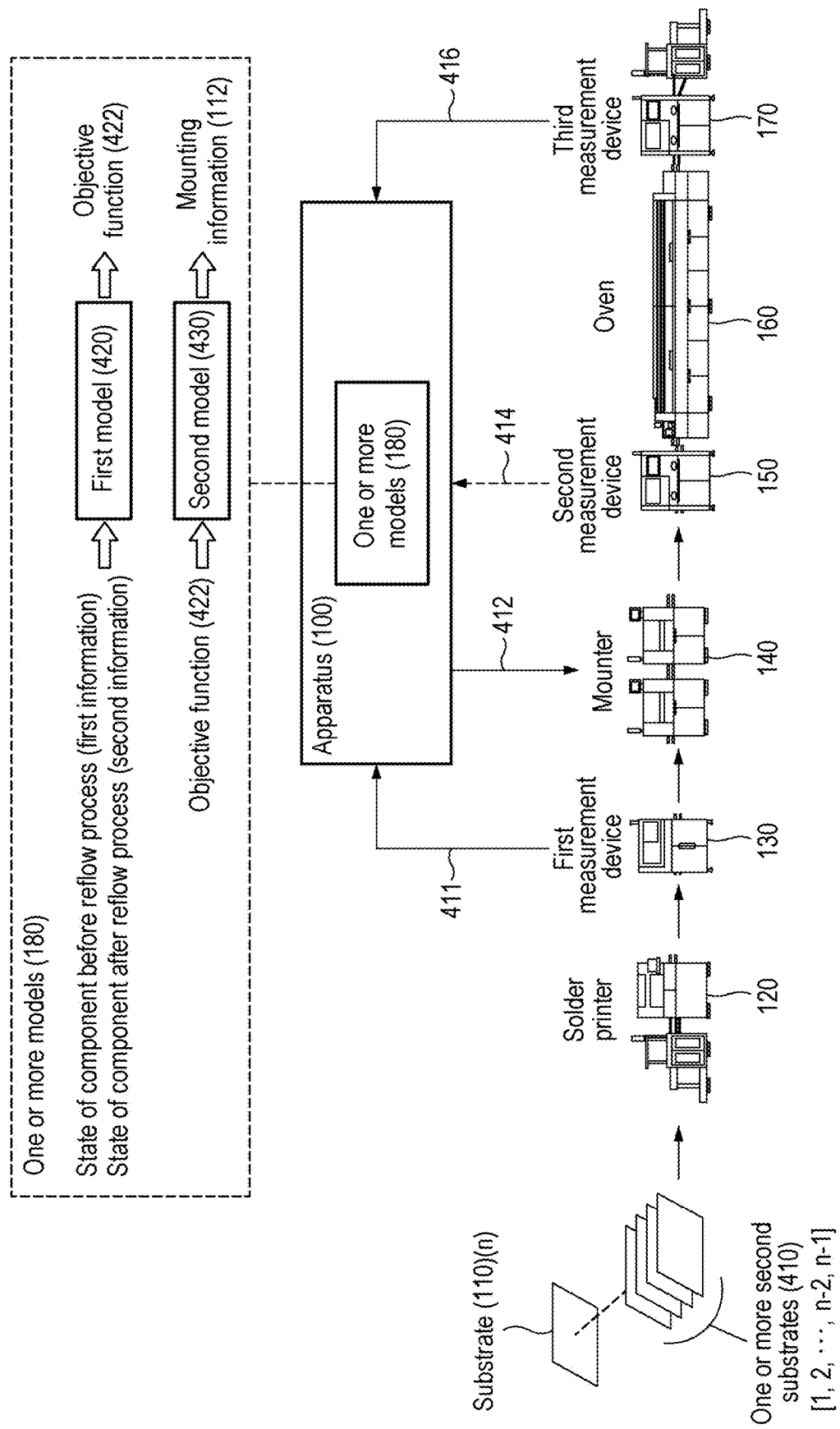
FIG. 4 is a diagram for explaining one or more models according to an embodiment of the present disclosure.

FIG. 4 is a diagram for explaining the one or more models 180 according to an embodiment of the present disclosure. As described above, the one or more models 180 may output the mounting information 112, which indicates an optimal mounting condition for mounting the first component on the first substrate 110, based on the correlation between the states of components (hereinafter, "second components") mounted on the second substrates 410 before and after the reflow processes for the second substrates 410. The one or more models 180 may be generated by an optimization algorithm for outputting an optimal mounting condition based on the correlation between the states before and after the reflow processes of the second components mounted on the second substrates 410. In one embodiment, the one or more models 180 may output the mounting information 112 based on an optimization algorithm. Available algorithms for this process may include a stochastic process such as a Monte Carlo method, a Bayesian optimization algorithm or the like, and/or a likelihood-based inference.

First, the Monte Carlo method may be used to solve most problems with probabilistic interpretation. By the law of large numbers, an integral consisting of an expected value of an arbitrary random variable may be approximated by taking an experimental mean (i.e., a sample mean) of independent samples of a variable. Using this property, a Markov chain Monte Carlo (MCMC) sampler may be used when the probability distribution of a variable is parameterized. The Monte Carlo method may include a Gibbs sampling algorithm. The Gibbs sampling algorithm is an MCMC algorithm for obtaining a series of observation values from a specified multivariate probability distribution when direct sampling is difficult.

A probabilistic process may refer to a mathematical object generally defined by random variables. The probabilistic process may represent numerical values of a system that change randomly over time. That is, the probabilistic process may be used as a mathematical model of systems and phenomena that appear to change in arbitrary ways. The probabilistic process may be interpreted by random variables. The probabilistic process may include a Markov process, a Gaussian process, a statistical model, a statistical inference such as a Bayesian inference or the like, random walks, martingales, a Levy process, random fields, renewal processes, and branching processes. Among them, the Bayesian inference is also called Bayes' inference, and is a statistical inference method in which additional information is acquired through experiments and then the hypothesis probability is updated using Bayes' theorem. The Bayesian inference is mainly applied when dynamically analyzing data to adapt to a given condition. In the field of artificial intelligence, the Bayesian inference is used when updating the knowledge learned from prior data with additional data according to conditions. A Bayesian optimization algorithm may be applied based on the Bayesian inference.

The likelihood-based inference may include an expectation-maximization algorithm and the like. The expectation-maximization algorithm may be an iterative algorithm that finds an estimated value of a parameter having a maximum likelihood or maximum a posteriori in a probability model that depends on an unobserved latent variable. The iteration of the expectation-maximization algorithm may include a process that performs an expectation step of generating a function for an evaluated log-expectation value through the use of a current estimated value for a parameter, and a maximization step of calculating a parameter that maximizes the expected log-expectation value. The expectation-maximization algorithm may be used to find a maximum expected value parameter of a statistical model in the case where an equation cannot be solved directly.

The one or more models 180 may include a first model 420 and/or a second model 430. The first model 420 may determine an objective function 422 for predicting the state of the first component after the reflow process for the first substrate from the state of the first component before the reflow process for the first substrate, based on information indicating the states of the second component before and after the reflow process for each of the second substrates 410. The second model 430 may output the mounting information 112 for mounting the first component on the first substrate 110, using the objective function 422 received from the first model 420.

Specifically, the first model 420 may predict the correlation between the states of the second component before and after the reflow process based on the pair of first information and second information. The first information indicates the state of the second component mounted on the second substrate before the reflow process, and the second information indicates the state of the second component after the reflow process. The correlation may be defined as an objective function 422. The objective function 422 may be a function representing a correlation between the first information and the second information. The objective function 422 may be a function for predicting the state of the component (e.g., first component) after the reflow process from the state of the component (e.g., first component) before the reflow process for any one substrate (e.g., first substrate). The objective function 422 may be a function determined (estimated) based on the pair of first information and second information accumulated by the first model 420. The first model 420 may correspond to a surrogate model in applying the Bayesian optimization algorithm. The first model 420 may determine the objective function 422 based on an artificial neural network model. In one embodiment, as the artificial neural network model, a tree-structured Parzen estimator (TPE), a deep neural network, a Gaussian process (GP) algorithm, or the like may be used.

The deep neural network may mean a method of improving a machine learning result by increasing the number of hidden layers in a model in an artificial neural network. An artificial neural network having, for example, two or more hidden layers may be referred to as a deep neural network. A computer may create a classification label by itself and may repeat a process of classifying data to derive an optimal solution. The TPE may be a sequential model-based optimization (SMBO) approach method. The SMBO approach method may sequentially construct models that approximate the performance of hyper-parameters, based on the past measurement, and then may select a new hyper-parameter to be tested based on these models.

The Gaussian process algorithm may construct a model of a system using the covariance and average value of variables in the probability distribution for multivariate. The Gaussian process algorithm has the advantage that, unlike the existing neural network circuits, if only the initial hyper-parameter is determined, it is not required to set an additional artificial parameter.

As described above, a substrate processing process may be sequentially performed on a plurality of substrates. If the above-described first substrate 110 is the (n)-th substrate, the 1st, 2nd, (n−2)-th, and (n−1)-th substrates on which the substrate processing process has been performed before the processing of the first substrate 110 may correspond to the second substrates 410 described above. Even in the substrate processing process for the second substrates 410, first information and second information indicating the states of the second component before and after the reflow process may be acquired. The first model 420 may determine (estimate) the above-described objective function 422 based on the pair of first information and second information acquired for the second substrates 410.

For a (k)-th second substrate among the second substrates 410, just like the first substrate 110, the solder measurement information 411, the previous component measurement information 414 indicating the state of the mounted second component measured before the reflow process, and/or the subsequent component measurement information 416 indicating the state of the mounted second component measured after the reflow process may be acquired. Furthermore, just like the first substrate 110, the apparatus 100 may determine the mounting information 412 for mounting a next second component on a (k+1)-th second substrate among the second substrates 410, based on the one or more models 180.

The solder measurement information 411 on the second substrates 410 may be compared with the solder measurement information 111 on the first substrate 110, and may be used to check whether or not the state of the solder printed on the first substrate 110 is changed as described above. In one embodiment, the solder measurement information 411 may be stored in the memory 220.

The processor 210 may input the pair of first information indicating the state of the second components before the reflow processes for the second substrates 410 and second information indicating the state of the second components after the reflow processes for the second substrates 410 to the first model 420. In one embodiment, the processor 210 may input the previous component measurement information 414 for the second substrates 410 as first information, and the subsequent component measurement information 416 as second information, to the first model 420. In another embodiment, the processor 210 may input the mounting information 412 on the second substrates 410 as first information, and the subsequent component measurement information 416 as second information, to the first model 420. In this embodiment, the process of acquiring the previous component measurement information 414 for each of the second substrates 410 may be omitted. The first model 420 may determine the objective function 422 based on the inputted information.

The second model 430 may output the mounting information 112 indicating an optimal mounting condition for mounting the first component on the first substrate 110 based on the corresponding objective function 422. That is, the second model 430 may predict the optimal mounting condition based on the objective function 422 determined by the pair of first information and second information accumulated up to the point at which the corresponding mounting information 112 is to be outputted. The optimal mounting condition may mean the state of a mounted component before the reflow process, which is required for the component to be successfully bonded to the substrate after the reflow process, or a condition for mounting the component in a state that is required for the component to be successfully bonded to the substrate after the reflow process. The expression "successfully bonded" may mean that the component is firmly bonded so as to be well-connected to the pads on the substrate. In one embodiment, the optimal mounting condition may mean a mounting condition that minimizes the positional offset of the first component with respect to the pads on the first substrate 110 after the reflow process for the first substrate 110. The outputted mounting information 112 may be delivered to the mounter 140 and may be used to mount the first component on the first substrate 110. The second model 430 may correspond to an acquisition function in applying the Bayesian optimization algorithm.

Figure 5:
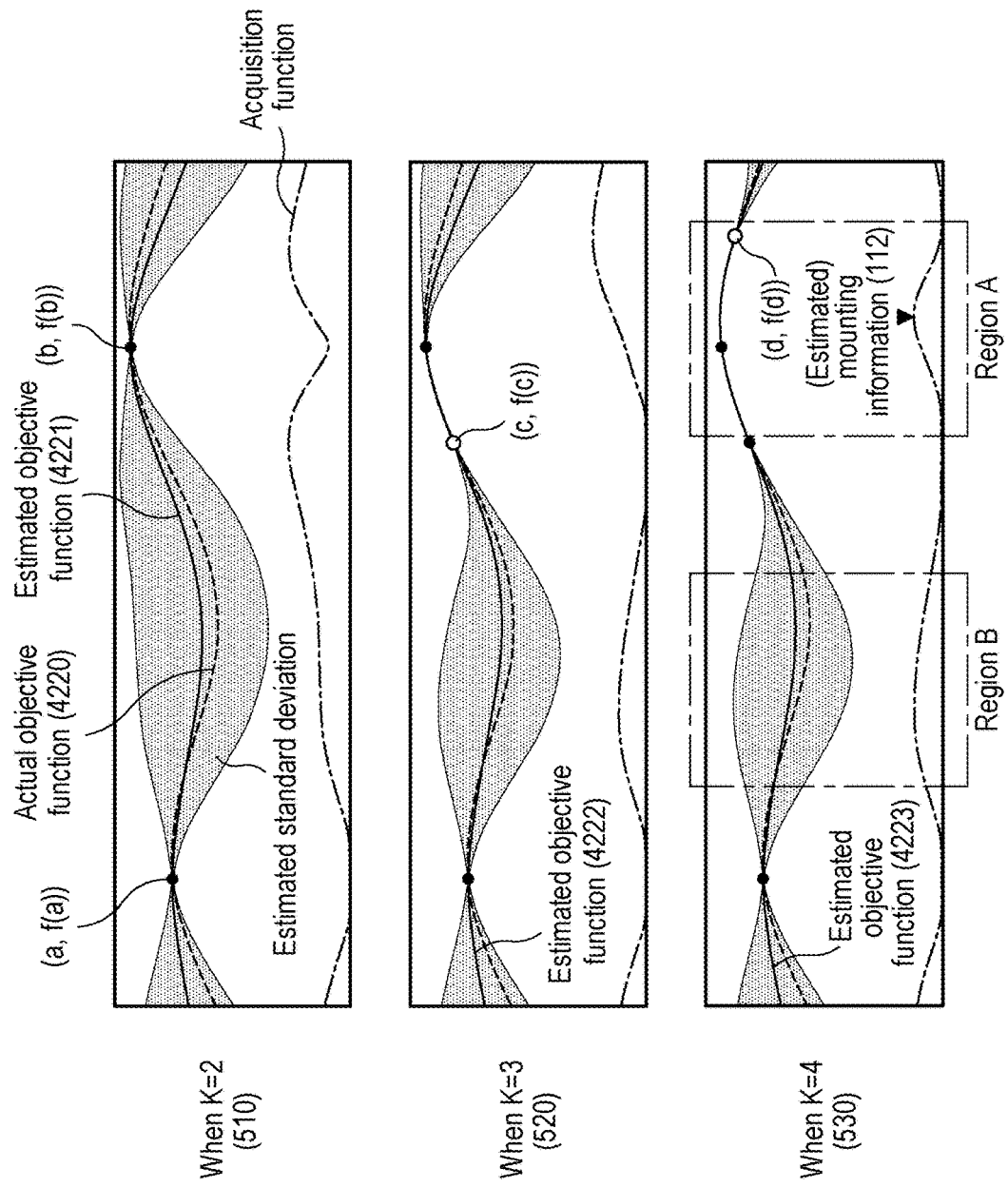
FIG. 5 is a diagram for explaining operation of a first model and a second model according to an embodiment of the present disclosure.

FIG. 5 is a diagram for explaining the operation of the first model 420 and the second model 430 according to an embodiment of the present disclosure. In each of the illustrated graphs, the x axis may mean a value of the first information indicating the state of the component before the reflow process, and the y axis may mean a value of the second information indicating the state of the component after the reflow process. The objective function 422 for predicting the state of the component after the reflow process from the state of the component before the reflow process may be expressed as f(x). In this case, if the state of the component indicated by the first information is denoted as "a", the state of the component indicated by the second information may be denoted as "f(a)". If it is assumed that the larger the value of f(x) is, the more successfully the component is connected to the substrate, the first model 420 and the second model 430 may investigate an input value x* that maximizes the value of f(x). The input value x* at this time may mean the state of the component before the reflow process, which is required to most successfully bond the component to the substrate, or the mounting condition for mounting the component in such a state. The f(x*) value at this time may mean the state of the component when the component is most successfully bonded to the substrate after the reflow process.

Specifically, the first model 420 may determine an objective function $f(x)$ for predicting the state of the component after the reflow process from the state of the component before the reflow process based on the pair of first information and second information respectively indicating the states of the component before and after the reflow process for the second substrate 410.

In one embodiment, two pairs of first information and second information respectively acquired from two second substrates 410 may be inputted to the first model 420 (graph 510). That is, (a, f(a)) and (b, f(b)) may be inputted to the first model 420. The first model 420 may determine (estimate) an objective function 4221 based on (a, f(a)) and (b, f(b)). In this case, the objective function 4221 estimated by the two pairs of first information and second information may be represented by a solid line in the illustrated graph 510. An objective function 4220 representing the actual correlation between the states of the component before and after the reflow process is indicated by a dotted line. The shaded region around the solid line may mean a standard deviation of the estimated objective function 4221. The standard deviation may mean a degree at which the estimated objective function 4221 may be different from the actual objective function 4220. Since the points (a, f(a)) and (b, f(b)) have already been identified as input values, it can be noted that the actual objective function 4220 and the estimated objective function 4221 cross each other and the standard deviation is also 0. In addition, as the distance from each of (a, f(a)) and (b, f(b)) increases, the uncertainty of the estimated objective function 4221 increases. Therefore, it can be seen that the standard deviation increases. That is, as the points are closer to (a, f(a)) and (b, f(b)), the objective function 4221 can be estimated to be more consistent with the actual objective function 4220. As the points are farther away from (a, f(a)) and (b, f(b)), the estimation of the objective function 4221 may be uncertain.

In one embodiment, one additional pair of first information and second information acquired from the next second substrate 410 may be inputted to the first model 420 (graph 520). That is, (c, f(c)) may be inputted to the first model 420. Now, the first model 420 may determine (estimate) an objective function 4222 by further considering (c, f(c)). Furthermore, in one embodiment, one additional pair of first information and second information acquired from the next second substrate 410 may be inputted to the first model 420 (graph 530). That is, (d, f(d)) may be inputted to the first model 420. Now, the first model 420 may determine (estimate) an objective function 4223 by further considering (d, f(d)).

As the number of pairs of information ("k" in FIG. 5) inputted to the first model 420 increases, the objective function may be estimated to be closer to the actual objective function 4220. As the information pair is inputted, the standard deviation region of the portion close to the information pair decreases. Therefore, it can be seen that the standard deviation region is compressed based on the actual objective function 4220. As the information indicating the states of the component before and after the reflow process for the second substrates 410 is inputted in this manner, the first model 420 can more accurately determine (estimate) the objective function 4223.

Meanwhile, the second model 430 may output the mounting information 112 to be applied to the next substrate, i.e., the first substrate 110, based on the objective function $f(x)$ estimated by the information from the second substrates 410. The second model 430 may output (recommend) the next input value expected to maximize the value of f(x) based on the estimated objective function $f(x)$. In this regard, the next input value is first information indicating the state of the component before the reflow process, and may be the mounting information 112 indicating a mounting condition for mounting the first component on the first substrate 110.

Specifically, the second model 430 may output (recommend) an input value "e" after "d", which is expected to maximize the value of f(x), based on the objective function 4223 (i.e., f(x)) estimated thus far for the second substrates 410.

The second model 430 may correspond to the acquisition function as described above. In the illustrated embodiment 530, the acquisition function of the second model 430 may be indicated by a one-dot chain line. The acquisition function may recommend the next input value x, which is expected to maximize the value of f(x), based on the objective function 4223 estimated so far. This process can be performed by an exploitation method and an exploration method.

The exploitation method may be a method of selecting a point to be investigated next from the vicinity of a point where the function value is maximum among points investigated so far (e.g., (a, f(a)), etc.). When observing only the points ((a, f(a)), (b, f(b)), (c, f(c)) and (d, f(d))) corresponding to the information previously inputted in the illustrated embodiment 530, there may be a high probability that an input value at which f(x) is maximized comes out near the point where the function value is larger (e.g., near the region A). Accordingly, the next input value may be selected and outputted (recommended) near the corresponding part (region A). The acquisition function also has a high value near the corresponding part (region A).

On the contrary, the exploration method may be a method of selecting a point to be investigated next from a part with a large standard deviation (i.e., uncertainty) which is far away from the points investigated so far (e.g., (a, f(a)), etc.). There may be a high probability that an input value at which f(x) is maximized comes out from the part (e.g., near the region B) which is distant from the points ((a, f(a)), (b, f(b)), (c, f(c)) and (d, f(d))) corresponding to the information previously inputted in the illustrated embodiment 530.

This is because the corresponding part has not been sufficiently investigated. It is not yet clear what function value will come out from the corresponding part. Accordingly, the next input value may be selected and outputted (recommended) near the corresponding part (the region B). The acquisition function also has a high value near the corresponding part (the region B).

Since the exploitation method and the exploration method have opposite characteristics, it is required to appropriately adjust the relative degree of application of the two methods.

According to an embodiment, an acquisition function that properly mixes the two methods may be selected and used in the second model 430. As the acquisition function of the second model 430, it may be possible to use a probability of improvement (PI) function, an expected improvement (EI) function, or an upper confidence bound (UCB) function.

In the illustrated embodiment 530, the second model 430 may output the mounting information 112, which is the next input value "e", in the region A. The mounting information 112 may indicate a mounting condition under which a component is mounted so as to reach the state of the component before the reflow process corresponding to the input value "e". The mounting information 112 may be delivered to the mounter 140. The mounter 140 may mount the first component on the first substrate 110 based on the mounting information 112.

Figure 6:
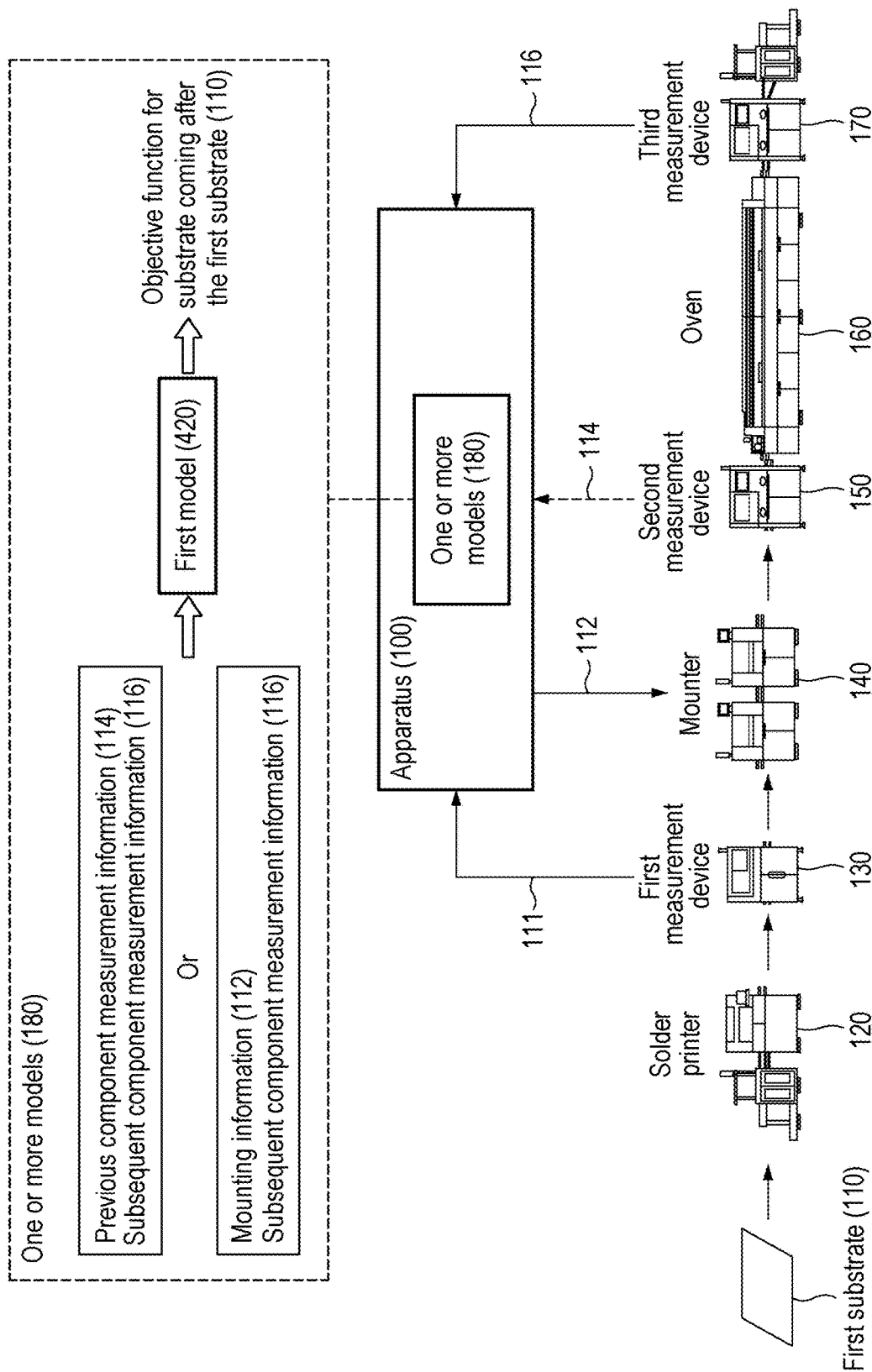
FIG. 6 is a diagram illustrating a process of updating the one or more models according to an embodiment of the present disclosure.

FIG. 6 is a diagram illustrating a process of updating the one or more models 180 according to an embodiment of the present disclosure. As described above, the processor 210 may determine the mounting information 112 to be applied to the first substrate 110 based on the one or more models 180. When mounting is performed on the first substrate 110 based on the mounting information 112, the previous component measurement information 114 and/or the subsequent component measurement information 116 may then be acquired for the first component on the first substrate 110. The previous component measurement information 114 and/or the subsequent component measurement information 116 may be delivered to the apparatus 100.

The processor 210 may input an additional pair of first information and second information to the first model 420. In one embodiment, the processor 210 may input the previous component measurement information 114 for the first substrate 110 as first information and the subsequent component measurement information 116 as second information, to the first model 420. In another embodiment, the processor 210 may input the mounting information 112 on the first substrate 110 as first information and the subsequent component measurement information 116 as second information, to the first model 420. In this embodiment, the process of acquiring the previous component measurement information 114 may be omitted for the first substrate 110. As described above, the first model 420 may newly determine an objective function based on the additionally inputted pair of first information and second information. The objective function may be used to determine the mounting information to be applied to a substrate on which a substrate processing process is performed next to the first substrate 110.

Figure 7:
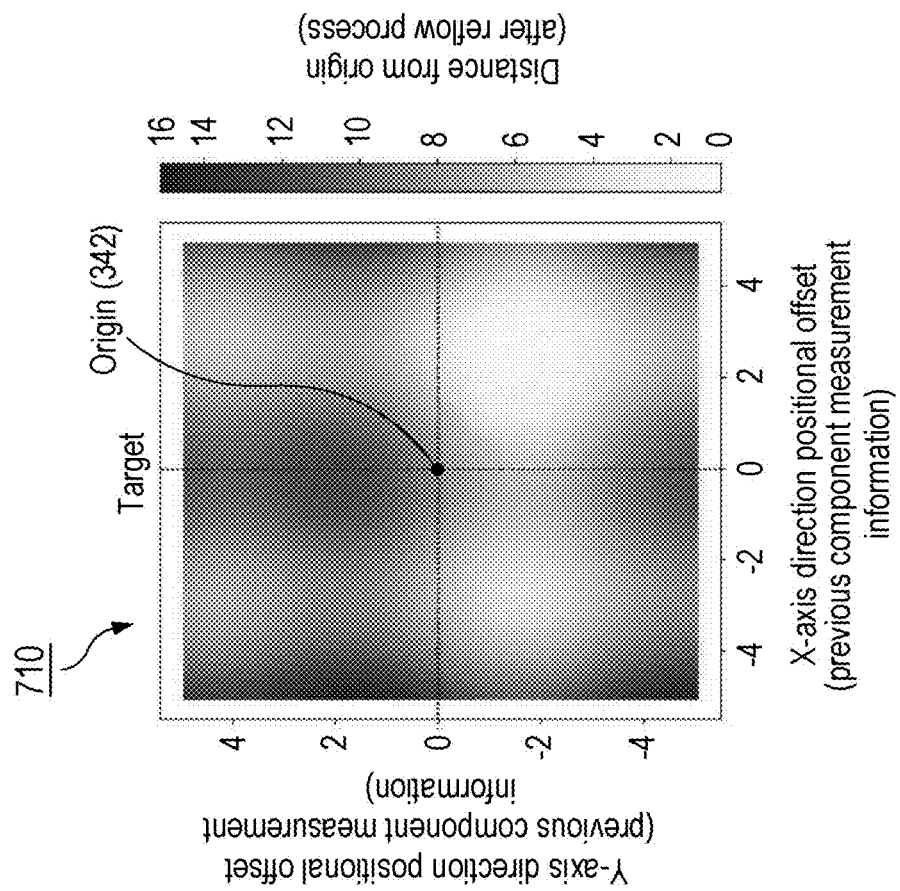
FIG. 7 is a diagram showing an example of a measurement result of a change in a positional offset of a component before and after a reflow process.

FIG. 7 is a diagram showing an example of a measurement result of a change in a positional offset of a component before and after a reflow process. The illustrated graph 710 shows the change in a positional offset of the component before and after the reflow process for a substrate. As described above, the substrate may be used as a coordinate plane, and the center point of the pads related to the component may be viewed as the aforementioned origin 342, i.e., a point of (0, 0). Two axes orthogonal to each other on the substrate based on the origin 342 may be referred to as an X axis and a Y axis, respectively. The horizontal axis of the graph 710 may represent the coordinate on the X axis (i.e., the X coordinate) of the component mounting position before the reflow process based on the origin 342. The vertical axis of the graph 710 may represent the coordinate on the Y axis (i.e., the Y coordinate) of the component mounting position before the reflow process based on the origin 342. The shade indicated by a point on the graph 710 may indicate a degree (distance) at which the component is spaced apart from the origin 342 after the reflow process when the component is mounted at the corresponding point. The brighter the shade, the closer the component is positioned to the origin 342, which is the center of the pads, after the reflow process. The darker the shade, the farther the component is positioned away from the origin 342 after the reflow process. Meanwhile, the graph 720 is a graph showing the graph 710 in three dimensions. In the graph 720, the distance from the origin 342 indicated by the shade is expressed on the Z axis.

Looking at the graph 710, it can be noted that the shade around (2, −1.5) is brightest. Similarly, in the graph 720, it can be seen that the Z-axis value is lowest around (2, −1.5).

Therefore, when a component is mounted near (2, −1.5), it can be seen that the component is relocated close to the origin 342 in the process in which the solder is melted and re-cured through the reflow process of the substrate.

Figure 8:
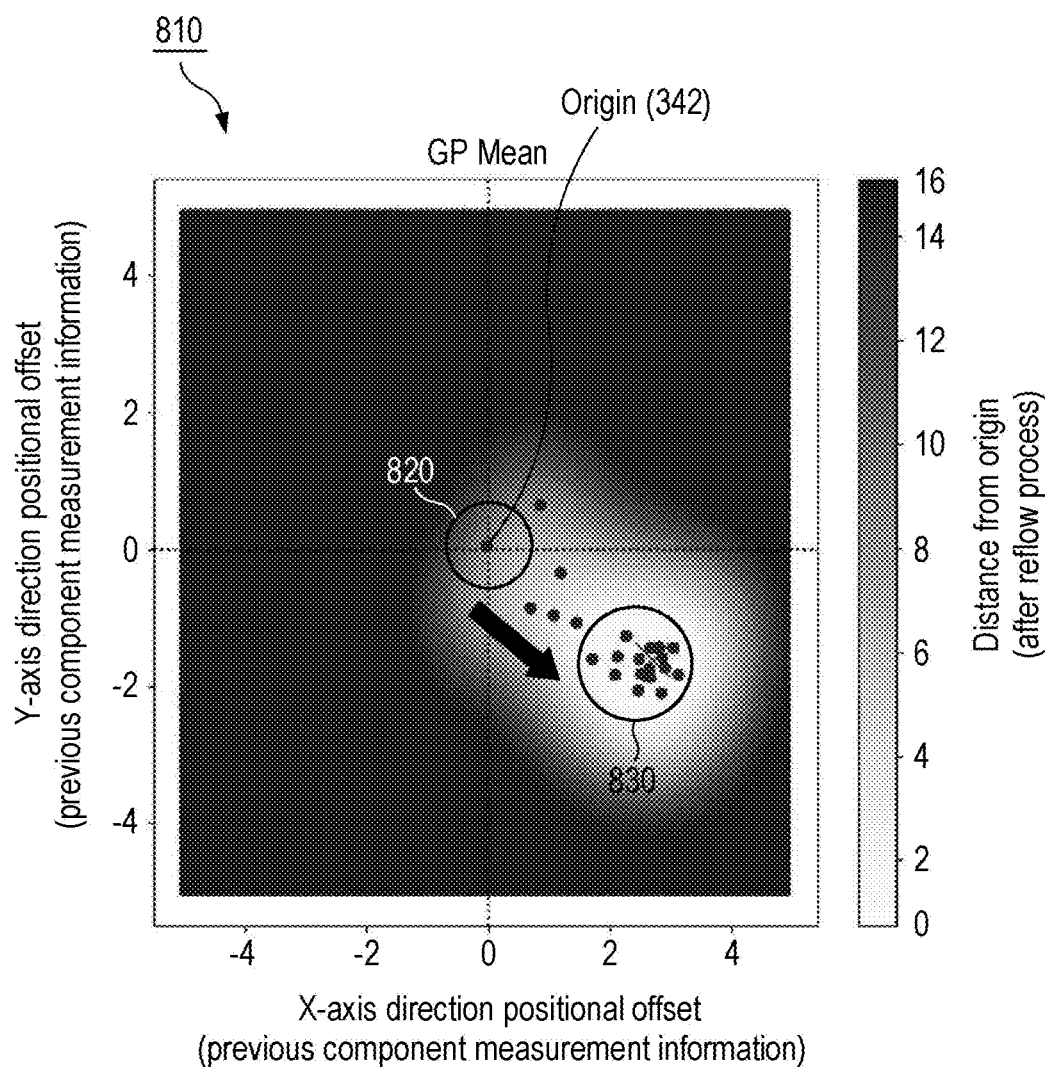
FIG. 8 is a diagram showing an example of a prediction result of a change in a positional offset of a component before and after a reflow process, which is predicted by the apparatus of the present disclosure.

FIG. 8 is a diagram showing an example of a predicting result of a change in a positional offset of a component before and after a reflow process by the apparatus 100 of the present disclosure. A plurality of substrates may sequentially undergo a substrate processing process. The apparatus 100 may sequentially determine mounting information to be applied to the substrates based on the mounting information determination technique according to the present disclosure. Each point on the illustrated graph 810 represents the mounting information determined by the apparatus 100. Specifically, each point may indicate a point at which a component is to be positioned during mounting among the determined mounting information. The legend for the graph 810 is the same as the legend for the graph 710 described above.

In the graph 810, the apparatus 100 initially determines the mounting information for mounting the component at the origin 342 (820). However, since the mounting information for the substrates is sequentially determined and the correlation between the positional offsets before and after the reflow process of the mounted component is more accurately predicted according to the mounting information, the apparatus 100 determines the mounting information so as to mount the component closer to (2, −1.5) (830). That is, the apparatus 100 determines the mounting information for positioning the component near (2, −1.5). In fact, since the shade near (2, −1.5) is bright, it can be seen that when the component is mounted near the corresponding point, the component is moved closer to the origin 342 during the reflow process. This is the same as the result according to the above-described measurement value. In this way, the apparatus 100 may determine the mounting information indicating an optimal mounting condition for a component to be successfully bonded to pads of a substrate according to the mounting information determination technique of the present disclosure.

Figure 9:
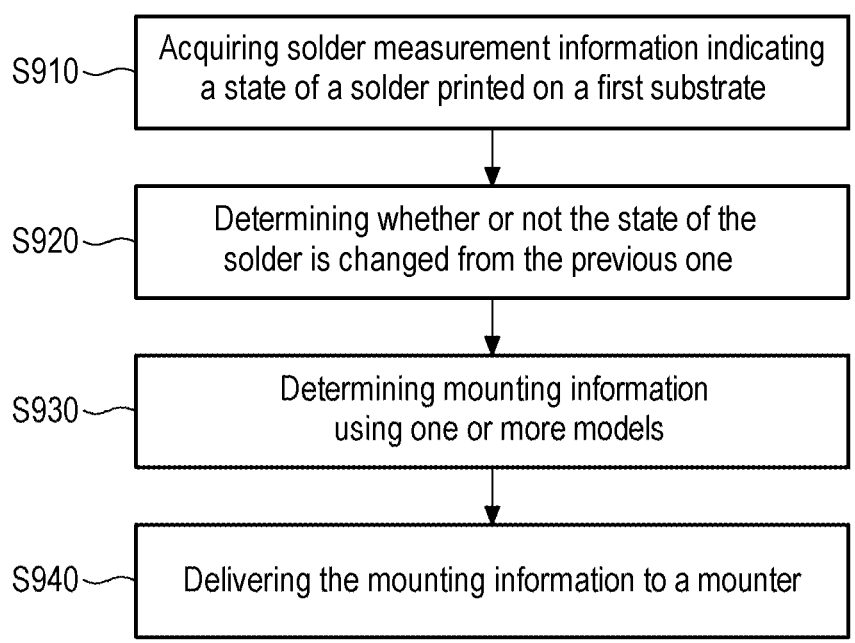
FIG. 9 is a diagram illustrating an example of a method for determining mounting information, which may be performed by the apparatus according to the present disclosure.

FIG. 9 is a diagram showing an example of a method for determining mounting information (i.e., a mounting information determination method), which may be performed by the apparatus 100 according to the present disclosure. The method for determining mounting information according to the present disclosure may be a computer-implemented method. Although the respective steps of the method or algorithm according to the present disclosure have been described in a sequential order in the illustrated flowchart, the respective steps may be performed in an order that can be arbitrarily combined by the present disclosure, in addition to being performed sequentially. The description in accordance with this flowchart does not exclude making changes or modifications to the method or algorithm, and does not imply that any step is necessary or desirable. In one embodiment, at least some of the steps may be performed in parallel, repetitively or heuristically. In one embodiment, at least some of the steps may be omitted, or other steps may be added.

The apparatus 100 according to the present disclosure may perform a method of determining mounting information according to various embodiments of the present disclosure. The method of determining mounting information according to an embodiment of the present disclosure may include acquiring solder measurement information indicating a state of a solder printed on a first substrate (S910), determining whether or not the state of the solder is changed from a previous state (S920), determining mounting information using one or more models (S930), and/or delivering the mounting information to a mounter (S940).

In S910, the processor 210 of the apparatus 100 may acquire the solder measurement information 111 indicating the state of the solder printed on the first substrate 110. In S920, the processor 210 may determine whether or not the state of the solder printed on the first substrate 110 is changed from the states of the solders printed on the second substrates 410, which are measured before the printing of the solder on the first substrate 110, based on the solder measurement information 111.

In S930, upon the determination that the state of the solder printed on the first substrate 110 is not changed from the previous state, the processor 210 may determine mounting information 112 indicating a mounting condition for mounting the first component on the first substrate 110, based on the one or more models 180 stored in the memory 220. In S940, the processor 210 may control the communication circuit 230 to deliver the mounting information 112 to the mounter 140. As described above, the one or more models 180 may be configured to output the mounting information 112 for the first substrate 110 based on the correlation between the states of the second component before and after the reflow process for each of the second substrates 410.

In one embodiment, the one or more models 180 may include a first model 420 and a second model 430. The first model 420 may be configured to determine an objective function 422 for predicting the state of the first component after the reflow process for the first substrate from the state of the first component before the reflow process for the first substrate based on the information indicating the states of the second component before and after the reflow process for each of the second substrates 410. The second model 430 may be configured to output the mounting information 112 using the objective function 422.

In one embodiment, the mounting information 112 may indicate a mounting condition for mounting the first component which is a condition that minimizes a positional offset of the first component with respect to the pads on the first substrate 110 after a reflow process for the first substrate 110.

In one embodiment, the processor 210 may input the previous component measurement information 114 indicating the state of the first component before the reflow process for the first substrate 110 and the subsequent component measurement information 116 indicating the state of the first component after the reflow process for the first substrate 110, to the first model 420.

In one embodiment, the processor 210 may input the mounting information 112 and the subsequent component measurement information 116 indicating the state of the first component after the reflow process for the first substrate 110, to the first model 420.

In one embodiment, the first model 420 may determine the objective function 422 based on an artificial neural network model. In one embodiment, the mounting information determination method may further include initializing the first model 420 by the processor 210 upon the determination that the state of the solder printed on the first substrate is changed.

In one embodiment, the communication circuit 230 may communicate with the first measurement device 130 for measuring the state of the solder printed on the first substrate 110, the mounter 140 for mounting the first component on the first substrate 110 based on the mounting information 112, the second measurement device 150 for measuring the state of the first component before the reflow process for the first substrate 110, and/or the third measurement device 170 for measuring the state of the first component after the reflow process for the first substrate 110. In one embodiment, the state of the solder printed on the first substrate 110 may include at least one selected from the position, orientation, volume, height and area of the corresponding solder.

Various embodiments of the present disclosure may be implemented as software recorded on a machine-readable recording medium. The software may be software for implementing the various embodiments of the present disclosure described above. The software may be inferred from various embodiments of the present disclosure by programmers in the art to which the present disclosure belongs. For example, the software may be commands (e.g., codes or code segments) or programs that can be read by a device. The device is a device capable of operating according to commands called from a recording medium, and may be, for example, a computer. In one embodiment, the device may be the apparatus 100 according to embodiments of the present disclosure. In an embodiment, the processor of the device may execute the called commands so that components of the device can perform a function corresponding to the commands. In one embodiment, the processor may be one or more processors 210 according to the embodiments of the present disclosure. The recording medium may refer to any type of device-readable recording medium in which data is stored. The recording medium may include, for example, a ROM, a RAM, a CD-ROM, a magnetic tape, a floppy disk, an optical data storage device, and the like. In one embodiment, the recording medium may be one or more memories 220. In one embodiment, the recording medium may be implemented in such a form that they are distributed in computer systems connected by a network. The software may be distributed, stored and executed in a computer system or the like. The recording medium may be a non-transitory recording medium. The non-transitory recording medium refers to a tangible medium irrespective of whether data is stored semi-permanently or temporarily, and does not include a signal propagating in a transitory manner.

According to the present disclosure, it is possible to determine an accurate component mounting position by adaptively considering various factors in a substrate processing process.

According to the present disclosure, it is possible to determine a component mounting condition that minimizes a positional offset of a component with respect to pads after a reflow process under a given solder state.

According to the present disclosure, it is possible to determine a mounting position of a component in real time using a small amount of data.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the contents of the disclosures. The accompanying claims and their equivalents are intended to cover such forms or modifications as would fall within the scope and contents of the disclosures.

What is claimed is:

1. An apparatus, comprising:
one or more processors;
one or more memories configured to store commands that cause the one or more processors to perform an operation when executed by the one or more processors; and
a communication circuit configured to communicate with a solder measurement device and a mounter,
wherein the one or more processors are configured to:
acquire solder measurement information indicating a state of a solder printed on a first substrate from the solder measurement device via the communication circuit;
determine whether or not the state of the solder is changed from states of solders printed on second substrates, which are measured prior to solder measurement of the first substrate, based on the solder measurement information;
upon the determination that the state of the solder is not changed, determine mounting information indicating a mounting condition for mounting a first component on the first substrate using one or more models stored in the one or more memories; and
deliver the mounting information via the communication circuit to the mounter, which mounts the first component on the first substrate on which the solder is printed, and
wherein the one or more models are configured to output the mounting information for the first substrate based on a correlation between states of a second component before and after a reflow process for each of the second substrates.

2. The apparatus of claim 1, wherein the one or more models include a first model and a second model,
wherein the first model is configured to determine an objective function for predicting a state of the first component after a reflow process for the first substrate from a state of the first component before the reflow process for the first substrate, based on information indicating the states of the second component before and after the reflow process for each of the second substrates, and
wherein the second model is configured to output the mounting information using the objective function.

3. The apparatus of claim 2, wherein the mounting condition for mounting the first component is a condition that minimizes a positional offset of the first component with respect to pads on the first substrate after the reflow process for the first substrate.

4. The apparatus of claim 2, wherein the one or more processors are further configured to:
input previous component measurement information indicating the state of the first component before the reflow process for the first substrate and subsequent component measurement information indicating the state of the first component after the reflow process for the first substrate, to the first model.

5. The apparatus of claim 2, wherein the one or more processors are further configured to:
input the mounting information and subsequent component measurement information indicating the state of the first component after the reflow process for the first substrate, to the first model.

6. The apparatus of claim 2, wherein the one or more processors are further configured to:
initialize the first model upon the determination that the state of the solder printed on the first substrate is changed.

7. The apparatus of claim 1, wherein the communication circuit is configured to communicate with a second measurement device and a third measurement device, and
wherein the second measurement device is configured to measure the state of the first component before a reflow process for the first substrate and the third measurement device is configured to measure the state of the first component after the reflow process for the first substrate.

8. The apparatus of claim 1, wherein the state of the solder printed on the first substrate includes at least one selected from a position, an orientation, a volume, a height and an area of the solder.

9. A method, comprising:
acquiring, by one or more processors, solder measurement information indicating a state of a solder printed on a first substrate from a solder measurement device by controlling a communication circuit;
determining, by the one or more processors, whether or not the state of the solder is changed from states of solders printed on second substrates, which are measured prior to solder measurement of the first substrate, based on the solder measurement information;
upon the determination that the state of the solder is not changed, determining, by the one or more processors, mounting information indicating a mounting condition for mounting a first component on the first substrate using one or more models stored in one or more memories; and
delivering, by the one or more processors, the mounting information to a mounter, which mounts the first component on the first substrate on which the solder is printed by controlling the communication circuit,
wherein the one or more models are configured to output the mounting information for the first substrate based on a correlation between states of a second component before and after a reflow process for each of the second substrates.

10. The method of claim 9, wherein the one or more models include a first model and a second model,
wherein the first model is configured to determine an objective function for predicting a state of the first component after a reflow process for the first substrate from a state of the first component before the reflow process for the first substrate, based on information indicating the states of the second component before and after the reflow process for each of the second substrates, and
wherein the second model is configured to output the mounting information using the objective function.

11. The method of claim 10, wherein the mounting condition for mounting the first component is a condition that minimizes a positional offset of the first component with respect to pads on the first substrate after the reflow process for the first substrate.

12. The method of claim 10, further comprising:
inputting, by the one or more processors, previous component measurement information indicating the state of the first component before the reflow process for the first substrate and subsequent component measurement information indicating the state of the first component after the reflow process for the first substrate, to the first model.

13. The method of claim 10, further comprising:
inputting, by the one or more processors, the mounting information and subsequent component measurement information indicating the state of the first component after the reflow process for the first substrate, to the first model.

14. The method of claim 10, further comprising:
initializing, by the one or more processors, the first model, upon the determination that the state of the solder printed on the first substrate is changed.

15. The method of claim 9, wherein the communication circuit is configured to communicate with a second measurement device and a third measurement device, and
wherein the second measurement device is configured to measure the state of the first component before a reflow process for the first substrate and the third measurement device is configured to measure the state of the first component after the reflow process for the first substrate.

16. The method of claim 9, wherein the state of the solder printed on the first substrate includes at least one selected from a position, an orientation, a volume, a height and an area of the solder.

17. A non-transitory computer-readable recording medium that stores commands for causing one or more processors to perform an operation when executed by the one or more processors, wherein the commands cause the one or more processors to:
acquire solder measurement information indicating a state of a solder printed on a first substrate from a solder measurement device by controlling a communication circuit;
determine whether or not the state of the solder is changed from states of solders printed on second substrates, which are measured prior to solder measurement of the first substrate, based on the solder measurement information;
upon the determination that the state of the solder is not changed, determine mounting information indicating a mounting condition for mounting a first component on the first substrate using one or more models; and
deliver the mounting information to a mounter, which mounts the first component on the first substrate on which the solder is printed by controlling the communication circuit, and
wherein the one or more models are configured to output the mounting information for the first substrate based on a correlation between states of a second component before and after a reflow process for each of the second substrates.

18. The recording medium of claim 17, wherein the one or more models include a first model and a second model,
wherein the first model is configured to determine an objective function for predicting a state of the first component after a reflow process for the first substrate from a state of the first component before the reflow process for the first substrate, based on information indicating the states of the second component before and after the reflow process for each of the second substrates, and
wherein the second model is configured to output the mounting information using the objective function.

* * * * *